(12) United States Patent
Hassemer et al.

(10) Patent No.: US 10,461,744 B2
(45) Date of Patent: Oct. 29, 2019

(54) PROXIMITY SENSOR CONNECTION MECHANISM

(71) Applicant: Google LLC, Mountain View, CA (US)

(72) Inventors: Brian Jon Hassemer, Gurnee, IL (US); Paul Lynn Fordham, Wauconda, IL (US); Mark Daniel Janninck, Glen Ellyn, IL (US); David Kyungtag Lim, Glenview, IL (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 15/711,374

(22) Filed: Sep. 21, 2017

(65) Prior Publication Data

US 2019/0089352 A1 Mar. 21, 2019

(51) Int. Cl.
*H03K 17/945* (2006.01)
*G06F 1/16* (2006.01)
(Continued)

(52) U.S. Cl.
CPC .......... *H03K 17/945* (2013.01); *G06F 1/1637* (2013.01); *G06F 1/1656* (2013.01);
(Continued)

(58) Field of Classification Search
CPC .......... G06F 3/044; G06F 1/1656; G06F 1/16; G06F 1/1601; G06F 1/1637; G06F 1/1626; G06F 1/1684; G06F 3/041; H03K 17/941; H03K 17/945; H03K 17/975; H03K 2017/9455; H05K 5/0017; H04M 1/026; H04M 1/0266; H04M 2250/12
See application file for complete search history.

(56) References Cited

U.S. PATENT DOCUMENTS 8,842,443 B2 9/2014 Lim et al.
9,093,745 B2 7/2015 Yarga et al.
(Continued)

FOREIGN PATENT DOCUMENTS

TW 201349662 12/2013
TW 1590425 7/2017

OTHER PUBLICATIONS

PCT International Search Report and Written Opinion issued in International Application No. PCT/US2018/036296, dated Sep. 10, 2018, 16 pages.
(Continued)

*Primary Examiner* — Dimary S Lopez Cruz
*Assistant Examiner* — Ingrid D Wright
(74) *Attorney, Agent, or Firm* — Fish & Richardson P.C.

(57) ABSTRACT

An electronic device includes: a display assembly including an electronic display configured to generate an optical image viewable from in front of the electronic device; a proximity sensor coupled to at least a portion of the display assembly, the proximity sensor including a sensing element configured to be responsive to presence of an object in front of the electronic device, the sensing element supported by a support structure having an upper surface facing a frontal direction of the electronic device; and a conductor that electrically connects the sensing element of the proximity sensor and the portion of the display assembly, the conductor including a conductive path extending along the support structure to the upper surface of the support structure.

18 Claims, 6 Drawing Sheets

(51) Int. Cl.
   *H04M 1/02*    (2006.01)
   *G06F 3/041*   (2006.01)
(52) U.S. Cl.
   CPC .......... *G06F 1/1684* (2013.01); *H04M 1/026* (2013.01); *G06F 3/041* (2013.01); *H03K 2017/9455* (2013.01); *H04M 1/0266* (2013.01); *H04M 2250/12* (2013.01)

(56) References Cited

U.S. PATENT DOCUMENTS

| | | |
|---|---|---|
| 9,368,429 B2 | 6/2016 | Ma et al. |
| 9,516,152 B2 | 12/2016 | Rudmann et al. |
| 2008/0006762 A1* | 1/2008 | Fadell .................. G01J 1/4204 250/201.1 |
| 2010/0315570 A1 | 12/2010 | Dinesh et al. |
| 2013/0076712 A1 | 3/2013 | Dong et al. |
| 2013/0114823 A1 | 5/2013 | Kari et al. |
| 2014/0145150 A1 | 5/2014 | De Jong et al. |
| 2014/0183342 A1 | 7/2014 | Shedletsky et al. |
| 2014/0252213 A1 | 9/2014 | Ruh et al. |
| 2015/0091849 A1 | 4/2015 | Ludden |
| 2016/0306042 A1 | 10/2016 | Schrank et al. |

OTHER PUBLICATIONS

TW Office Action in Taiwanese Appln. 107120266, dated Apr. 24, 2019, 12 pages (with English translation).

* cited by examiner

PROXIMITY SENSOR CONNECTION MECHANISM

BACKGROUND

Many electronic devices include displays and various types of sensors, such as proximity sensors. Displays in such devices are generally driven by a processor located on a circuit board disposed within the interior of a housing of the device. The processor of such devices typically receives signals from the sensors of the electronic device and uses those signals to control the device (e.g., to determine what visual content is output by the display). Various types of electrical connections and conductive lines transfer signals between sensors, processors, and other components of such electronic devices.

SUMMARY

This disclosure relates to a mechanism for connecting a sensor of an electronic device to another component of the device that is located in front of the sensor. As discussed in detail below, various embodiments incorporating this mechanism provide substantial benefits in terms of space savings that allow for smaller devices and/or more efficient packaging of device components within a housing, as well as robust and efficient manufacturing processes affording reduced assembly gaps, tolerance loops, and fewer components.

Many mobile computing devices include a proximity sensor configured to sense the presence (e.g., incidence or movement) of an object in front of the device. A purpose of this sensor is to enable the mobile computing device to determine when the device is being held to the side of a user's head during use or when the device is located in an enclosed space, such as a bag or pocket. In response to such a determination, the computing device can disable certain functions to inhibit accidental operation of the device by the user and/or to reduce power consumption. For example, the computing device may disable touch screen input and/or deactivate one or more portions of a display panel.

The proximity sensor typically includes a sensing element (e.g., an infrared emitter and detector) and a housing that secures the sensing element in place. Conductive lines (e.g., traces and vias) may electrically connect the sensing element to an electrical connection point (e.g., a conductive pad, pin, or terminal) that is located on a backside (i.e., an exposed rear surface) of the proximity sensor. This backside connection point enables the proximity sensor to mate with a corresponding electrical connection point on the front-side surface of a circuit board (e.g., a printed circuit board "PCB"). The circuit board may include a conductive trace leading away from the connection point and towards some other component of the electronic device, such as a microprocessor.

The above-described configuration may result in a stacked assembly of components that occupies more space than is desirable in the Z direction of the computing device. The "Z direction" refers to the direction in which the main display of the computing device produces an optical image, as opposed to the X-Y directions of the device that define a plane in which the display is located. Arrangements according to the presently disclosed technology that electrically connect the proximity sensor to a component in "front" of the proximity sensor along the Z direction can provide various benefits. For example, such arrangements may: (1) reduce the space occupied by the assembly of components in the Z direction by providing a conductive path from the proximity sensor that at least partially bypasses the circuit board; (2) free up space on the surface of the circuit board at which the proximity sensor may otherwise have been located or across which electrical traces for the proximity sensor would have flowed; and/or (3) facilitate "borderless" or "extended-display" configurations for the computing device by enabling the proximity sensor to be mounted to a portion of the display assembly, such that the display assembly may extend closer to the edge of the device.

A "borderless" configuration can promote a desirable visual aesthetic by reducing the area of a bezel or border around the active display region of the display, increasing the visible area of the display without increasing the overall dimensions of the device, or reducing the overall dimensions of the device without reducing the visible area of the display panel. A larger display can also recognize touch inputs that otherwise may have inadvertently occurred outside the sensing boundary of the display (e.g., at the bezel of the device).

Certain configurations described herein can facilitate robust and efficient manufacturing processes by reducing assembly gaps (i.e., the space between components) and/or by reducing tolerance loops that may otherwise accrue in conventional configurations. In some examples, locating the proximity sensor on a portion of the display assembly may allow the sensor to be more readily positioned with respect to certain other related components of the device (e.g., a port in the cover of the device or a cover surface through which the proximity sensor emits and detects signals). Moreover, routing a conductive path from the proximity sensor through the display assembly can reduce the number of components of the device and/or reduce the complexity and thickness of the device's circuit board.

In an example configuration that may achieve one or more of the above-described advantages, the location of the circuit board at which the proximity sensor may otherwise be attached (e.g., a circuit board that includes a processor) includes a recess into which the proximity sensor is mounted. The proximity sensor may be structured as typical with its external connection point on its backside. The external connection point may electrically mate with a corresponding electrical connection point located in the recess of the circuit board. A conductive path may run from the electrical connection point in the recess along (e.g., across and/or through) a portion of the circuit board to the front side of the circuit board, at which point another external connection point may be located. This frontward facing external connection point (not in the recess) may serve as an interface at which the circuit board connects directly or indirectly to another component in front of it (e.g., a display assembly). The display assembly may include multiple layers, one of which may include a conductive trace that routes electrical signals between the proximity sensor and a remote electronic component (e.g., a processor). The conductive trace on the layer of the display assembly may connect elsewhere on the display assembly to a flex or connector that routes the electrical signals to the remote electrical component.

In another example, the proximity sensor is not attached to a circuit board but rather is mounted to a separate support structure (e.g., an interposer or jumper board). This separate support structure may include a recess into which the proximity sensor mounts as previously described, and may include conductive traces and/or vias that extend along (e.g., across and/or through) the support structure to connect with an electrical connection point on a front surface of the support structure. Stated generally, the support structure may serve as an accessory to which a proximity sensor with a rearward-facing electrical connection point can be mounted to provide the proximity sensor with a frontward-facing electrical connection point. This support structure itself may be electrically mounted to a component placed in front of the support structure (and the proximity sensor), for example, a portion of a display assembly as described above. In this configuration, the support structure may not be physically mounted to any component at its rear, such that the support structure may effectively "float" separate from components behind it (or at least is not affixed to such components). Such a configuration can free up space on a circuit board to which the support structure may normally attach. As described above, the component to which the support structure is attached on its front surface (e.g., whether that component is a display assembly or some other component of the computing device) may route conductive traces, and therefore electrical signals, between the proximity sensor and some other electronic component of the computing device.

In yet another example, the housing of the proximity sensor itself has electrical traces and/or vias that route from a backside of the sensing element and along (e.g., across and/or through) the housing to an electrical connection point exposed on a front surface of the housing. The proximity sensor may then mount to a portion of the computing device in front of the proximity sensor as described above.

As additional description to the embodiments described below, the present disclosure describes the following embodiments.

In some embodiments, an electronic device includes: a display assembly including an electronic display configured to generate an optical image viewable from in front of the electronic device; a proximity sensor coupled to at least a portion of the display assembly, the proximity sensor including a sensing element configured to be responsive to presence of an object in front of the electronic device, the sensing element supported by a support structure having an upper surface facing a frontal direction of the electronic device; and a conductor that electrically connects the sensing element of the proximity sensor and the portion of the display assembly, the conductor including a conductive path extending along the support structure to the upper surface of the support structure.

In some examples, the support structure is physically and electrically connected to the portion of the display assembly by one or more connections at the upper surface of the support structure. In some examples, the one or more connections at the upper surface of the support structure provide the only connection of the proximity sensor to another component of the electronic device.

In some examples, the portion of the display assembly coupled to the proximity sensor includes at least one of a display panel or a cover located atop the display panel.

In some examples, the portion of the display assembly coupled to the proximity sensor includes an extension tab projecting outward from an edge of a substrate of the display assembly.

In some examples, the support structure includes a housing that includes: (i) a base to which the sensing element is mounted, and (ii) a frame extending from the base to define the upper surface of the support structure. In some examples, the frame includes a molded monolithic body, and the conductor includes an integral portion of the body of the frame.

In some examples, the support structure includes a body carrying a housing of the proximity sensor within which the sensing element is disposed. In some examples, the body of the support structure is connected to a portion of a circuit board. In some examples, the body of the support structure is comprised of a non-conductive semiconductor material, and the conductor extends through a portion of the body. In some examples, the body of the support structure includes a recess defining a floor between opposing raised shoulders, the housing of the proximity sensor mounted to the floor, and the shoulders defining the upper surface of the support structure.

In some embodiments, a portable electronic device includes: a substrate coupled to a body of the device; a sensor assembly including a sensing element configured to transmit and receive signals, the sensor assembly further including a front surface physically attached and electrically connected to the substrate; and a conductor electrically connecting the sensing element and the substrate, the conductor including a conductive path extending from the sensing element to the front surface of the sensor assembly.

In some examples, the substrate includes a portion of a display assembly, and the sensor includes a proximity sensor.

In some examples, the sensor assembly includes a housing receiving the sensing element, and the front surface of the sensor assembly includes a portion of the housing. In some examples, the housing includes: (i) a base to which the sensing element is mounted, and (ii) a frame extending from the base to define the upper surface of the sensor assembly. In some examples, the frame includes a molded monolithic body, and the conductor includes an integral portion of the body of the frame.

In some examples, the sensor assembly includes a body of non-conductive semiconductor material carrying a housing within which the sensing element is disposed, and the conductor extends through a portion of the body of semiconductor material. In some examples, the body of semiconductor material includes a recess defining a floor between opposing raised shoulders, the housing mounted to the floor, and the shoulders defining the upper surface of the sensor assembly.

In some embodiments, a method of manufacturing an electronic device includes the steps of: providing a display assembly configured to generate an optical image viewable from a frontal direction of the electronic device, the display assembly including one or more conductive lines extending along the display assembly; positioning a proximity sensor in a rearward location relative to at least a portion of the display assembly, the proximity sensor including a sensing element arranged to be responsive to presence of an object in front of the electronic device; and while the proximity sensor is in the rearward location, coupling the proximity sensor and the display assembly to form a conductive path from the sensing element to the conductive lines of the display assembly.

The details of one or more embodiments are set forth in the accompanying drawings and the description below. Other features and advantages will be apparent from the description and drawings, and from the claims.

DETAILED DESCRIPTION

Figure 1A:
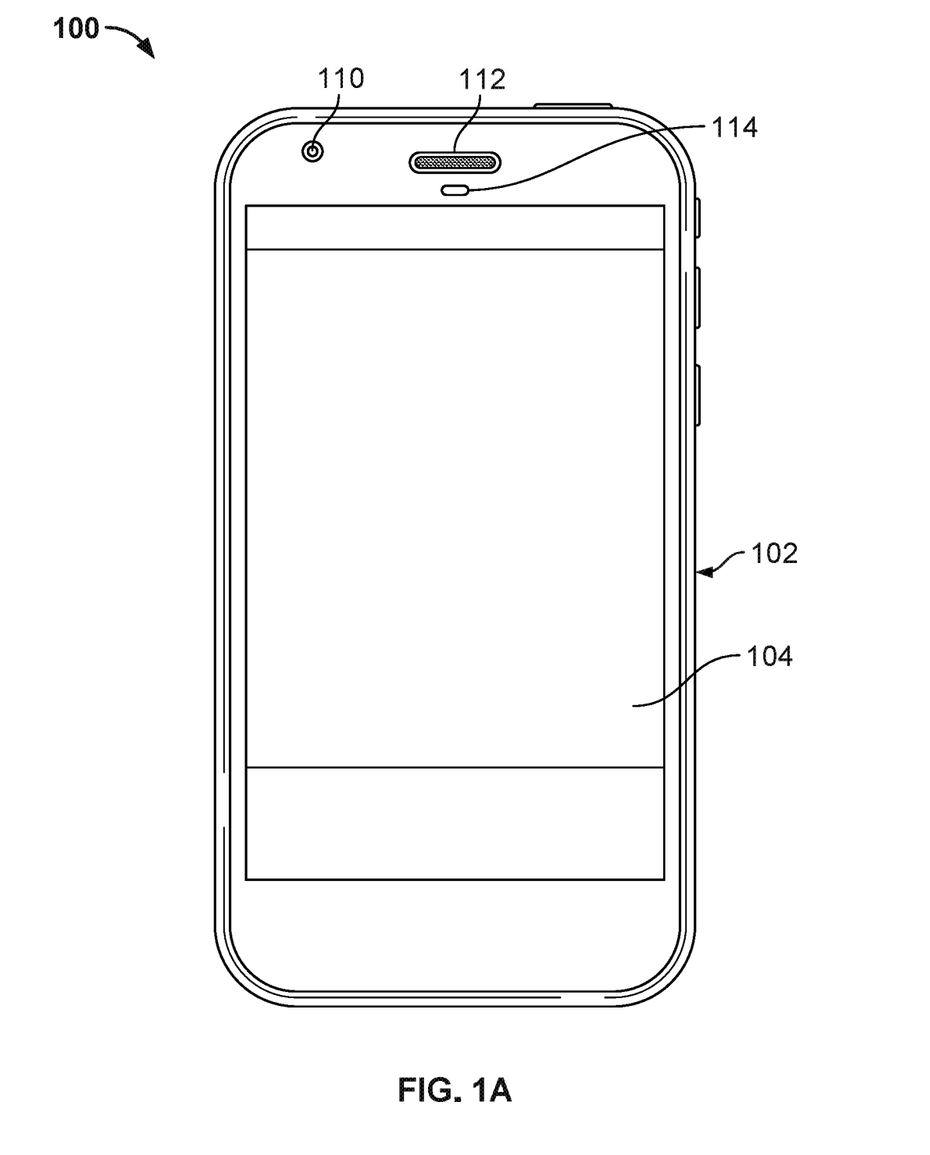
FIGS. 1A and 1B are front and perspective views of an electronic device that includes a proximity sensor and a conductive path extending from the sensor in a frontal direction of the device.
Figure 1B:
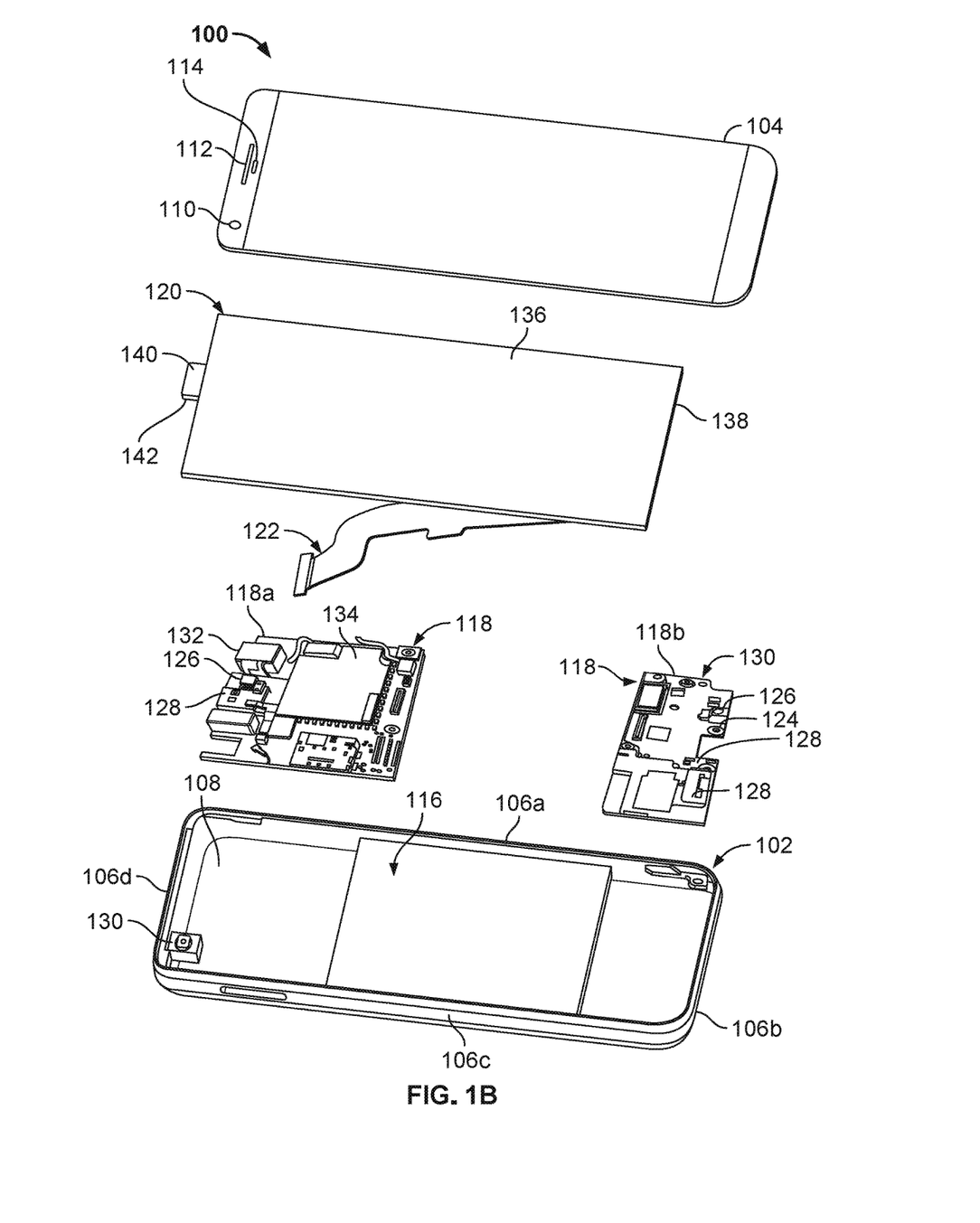

FIGS. 1A and 1B depict an example electronic device 100 within which various proximity sensor arrangements described throughout this disclosure can be incorporated. In FIGS. 1A and 1B, electronic device 100 is provided in the form of a mobile phone with an integrated computer and display (a "smartphone"), but other types of electronic devices are also contemplated by the disclosed technology. Such devices may include, but are not limited to: a digital music player, a tablet computing device, a laptop computing device, a wearable electronic device, and/or a data storage device.

As shown in FIGS. 1A and 1B, electronic device 100 includes a housing 102 and a cover 104 fitted to housing 102. Together, housing 102 and cover 104 define an interior volume receiving various components of electronic device 100. In this example, a housing 110 provides a bucket-type enclosure having first, second, third, and fourth side walls 106a,b,c,d extending integrally from a broad rear face 108. This bucket-type enclosure allows the various components of electronic device 100 to be accommodated within housing 102 and enclosed by cover 104. Housing 110 may be constructed from a material having adequate structural rigidity to provide a degree of physical support and protection to the enclosed components of electronic device 100. For instance, housing 110 may be formed from a single piece of metal or plastic.

Various other types of housing configurations suitable for at least partially supporting and/or enclosing certain components of an electronic device can be used without departing from the scope of the present disclosure. For instance, one or more of the side walls and/or the rear face of the housing may be formed separately and subsequently joined together (e.g., via adhesives, welds, snap-fit connectors, fasteners, etc.). Alternatively or additionally, one or more portions of such a housing could be formed from glass, wood, carbon fiber, ceramic, combinations thereof, and/or other materials.

As noted above, cover 104 is fitted to housing 102 to enclose an interior volume within which various components of electronic device 100 are received. Cover 104 includes three ports for exposing certain of the enclosed components, namely a camera port 110, a speaker port 112, and a proximity sensor port 114. In the illustrated example, cover 104 is the outermost structural element of electronic device 100, but other configurations are also contemplated. For example, an additional layer of transparent plastic or glass could be secured atop cover 104. In other examples, the cover may be configured to allow certain transmissions (e.g., light and/or sound) to freely pass through it, thus negating the need for ports.

The components enclosed by housing 102 and cover 104 may include various electronic devices that enable the functionality of electronic device 100. For example, such components may include a battery 116, a circuit board 118, a display assembly 120, and a flex conductor 122.

Battery 116 provides a primary source of power for the other components of electronic device 100. In some examples, battery 116 may include a secondary cell, rechargeable battery configured for use through thousands of battery charging cycles over the entire useful life of electronic device 100. In some examples, battery 116 may be a lithium polymer battery, lithium ion battery, nickel metal hydride battery, nickel cadmium battery, or other battery type configured to power electronic device 100 over many charging cycles. Alternatively or additionally, battery 116 may include a primary cell battery configured to be replaced when substantially discharged.

Circuit board 118 is configured to accommodate components of electronic device 100 in a space-efficient manner, and provide robust mechanical and electrical connections between these components. By way of example, circuit board 118 is depicted accommodating a microphone 124, speakers 126, various sensors 128 (e.g., fingerprint sensors, accelerometers, etc.), a front-facing digital camera assembly 130, flash devices 132, and a processor 134. Various other components suitable for use in an electronic device could also be accommodated by circuit board 118 without departing from the scope of the present disclosure. Moreover, in this example, circuit board 118 includes a top circuit board 118a and a bottom circuit board 118b. As shown, top and bottom circuit boards 118a,b are arranged at respective top and bottom end regions of housing 102. In the illustrated example, top and bottom circuit boards 118a,b are separately formed circuit boards and may be electrically connected by an electrical conductor (not shown) bridging the gap between them. In other examples, the top and bottom circuit boards are integrally formed as a unitary circuit board (e.g., joined by a third circuit board extending between the top and bottom circuit boards).

In this example, battery 116 is positioned proximate (e.g., adjacent) top and bottom circuit boards 118a,b and positioned in a substantially central location between the top and bottom ends of housing 102. In other examples, the battery may be positioned in a stacked configuration such that circuit boards are between the battery and the display assembly (e.g., sandwiched between them), or vice versa. In some examples, one or more electrical conductors may extend through battery 116 to allow electrical communication between top circuit board 118a and bottom circuit board 118b via battery 116.

Display assembly 120 provides a user interface that displays information to a user. For example, display assembly 120 may provide a touch screen display that a user can interact with to view displayed information and to provide input to electronic device 100. In this example, display assembly 120 occupies the majority of a front major face of electronic device 100, and includes a visible display (e.g., a rectangular visible display having curved surfaces near the perimeter edges).

Display assembly 120 may include one or more substrate layers that provide the visible display and/or allow display assembly 120 to receive touch input from a user. For example, cover 104 may serve as a constituent component of display assembly 120, providing an outermost layer that encloses other layers of display assembly 120. In the context of this example, a user may physically touch cover 104 to provide input to electronic device 100. A touch sensor device, such as a resistive touchscreen panel, a surface acoustic wave device, or a capacitive touchscreen panel, may receive the touch input through cover 104 and provide an indication of such touch input to processor 134. The touch sensor device may be adapted to receive touch input across the active display region of the display panel (e.g., at least the majority of the front face of the electronic device) to select user interface elements that are displayed by the display assembly.

Display assembly 120 includes a display panel 136, such as a liquid crystal display (LCD) panel including a liquid crystal material positioned between one or more color filter and thin-film-transistor (TFT) layers. The layers of display panel 136 may include substrates formed from glass or polymer, such as polyamide, polyethylene terephthalate, polyethylene naphthalate, etc. In various embodiments, display assembly 120 may include a light-emitting diode (LED) display panel, an organic light-emitting diode (OLED) display panel, such as an active-matrix organic light-emitting diode (AMOLED) display, a plasma display panel, an electronic ink display panel, or some other type of display panel that provides visual output to a user. In this example, display assembly 120 includes a polarizer 138 located in front of the display panel 136.

In addition to display panel 136, display assembly 120 may include various other components to facilitate manufacturing, non-destructive installation, and reliable operation of display assembly 120. For example, display assembly 120 may include one or more support substrates (e.g., relatively rigid plates), adhesive layers, and/or conductive substrates.

Display assembly 120 may include driver circuitry used to control display output and/or receive user input. In some embodiments, driver circuitry includes a display integrated circuit mounted in electrical communication with the TFT layers of display panel 136, for example by gate lines or other electrical connections. The display integrated circuit may receive display data from processor 134, for example, and deliver corresponding signals to control the optical properties of a liquid crystal layer to produce a display output (or perform other functions). The display integrated circuit may be located on display panel 136, flex conductor 122, and/or another component of electronic device 100. For example, the display integrated circuit may be positioned at a bottom region of display panel 136, at a top region of display panel 136, along a side region of display panel 136, on flex conductor 122, etc.

The connection between the display integrated circuit and circuit board 118 (and particularly processor 134, for example) may be provided by an electrical conductor that facilitates a robust electrical connection while maintaining a space-efficient and low profile configuration that does not significantly increase the overall dimensions of electronic device 100. In an example embodiment, flex conductor 122 connects the display integrated circuit and circuit board 118. Flex conductor 122 includes conductive structures on a thin, flexible substrate. Flex conductor 122 has a relatively thin profile and may be bent along a longitudinal direction to fit between various components of electronic device 100, such as to connect from a front face of a display substrate to circuit board 118 by passing between battery 116 and a rear portion of display assembly 120. Conductive structures of flex conductor 122 may include conductive lines (e.g., printed conductive traces) or other conductive components that provide electrical connection between respective electrical contacts associated with the display integrated circuit and circuit board 118. Flex conductor 122 may be a single, double, or multi-layer flexible printed circuit including a polyamide, PEEK, polyester, etc., having printed or laminated conductive elements, for example. Such construction provides robust electrical characteristics that can provide reliable connection between various components while having a low bending radius that facilitates compact arrangement of flex conductor 122 within electronic device 100.

In this example, display assembly 120 includes an extension tab 140 coupled to a proximity sensor 142. Any structural component of display assembly 120 may form all or a substantial portion of extension tab 140. For example, extension tab 140 may include one or more layers of display panel 136, one or more of support and/or conductive substrates, adhesives, films, or a combination of such elements. As shown, extension tab 140 projects outward from a top region of display assembly 120 to align proximity sensor 142 with proximity sensor port 114 of cover 104.

Proximity sensor 142 includes a sensing element responsive to the presence (e.g., incidence or movement) of an object (e.g., a human user) in front of electronic device 100. Suitable sensing elements may include an infrared sensor, a capacitive sensor, an inductive sensor, an ultrasonic sensor, or other types of sensors, or combinations of multiple sensors. The emitter-detector pair of the sensing element is mounted in a housing (e.g., housing 244 or 344 discussed below with reference to FIGS. 2, 3A, and 3B), and may be separate or integrated components. Output from proximity sensor 142 can be used by one or more processors of electronic device 100 (e.g., processor 134, the driver circuitry of display panel 120, or some other onboard processor) as a control input. For example, output from proximity sensor 142 indicating the presence of an object may cause electronic device 100 to react by disabling one or more functions of display assembly 120, such as the touchscreen input or visual output functions to inhibit unintentional user input and/or to conserve battery power.

Proximity sensor 142 may be connected to extension tab 140 directly or indirectly via one or more intermediate layers or components. In some examples, extension tab 140 provides a substrate that can physically support proximity sensor 142 by bearing at least a portion of its weight. Alternatively or additionally, proximity sensor 142 may be physically supported by a rigid or flexible circuit board. Extension tab 140 is configured to facilitate electrical communication between proximity sensor 142 and another component of electronic device 100 (e.g., processor 134). Accordingly, extension tab 140 includes conductive lines (e.g., wires, traces, etc.) that extend a conductive path (i.e., a path suitable for conveying electrical signals) from proximity sensor 142. This conductive path is routed from extension tab 140, through other portions of display assembly 120, and towards flex conductor 122, which is in electrical communication with circuit board 118. For example, the conductive path may be routed through one or more layers of display panel 136, such as the TFT layer, a polyamide substrate layer, a layer having touch sensing capability (e.g., a polyethylene (PET) layer), or some other conductive layer. In some examples, the conductive path through display panel 136 may include one or more electrical traces formed of indium-tin-oxide (ITO), silver, or other suitable conductive materials.

In some examples, the electrically conductive lines traversing display assembly 120 to form the conductive path from proximity sensor 142 may pass through or between multiple components of display assembly 120. As one of many examples, the conductive lines may run through both display panel 136 and polarizer 138, with the respective lines of each component being electrically connected to one another to form a conductive path. In some other examples, display assembly 120 does not include additional electrical connections or conductive lines beyond those provided by display panel 136. In such examples, display panel 136 provides the exclusive conductive path from proximity sensor 142. In still some other examples, proximity sensor 142 can be directly attached to cover 104 absent extension tab 140. In this configuration, the conductive path may extend along a portion of cover 104, traversing either the cover substrate itself or a film attached to the substrate.

Figure 2:
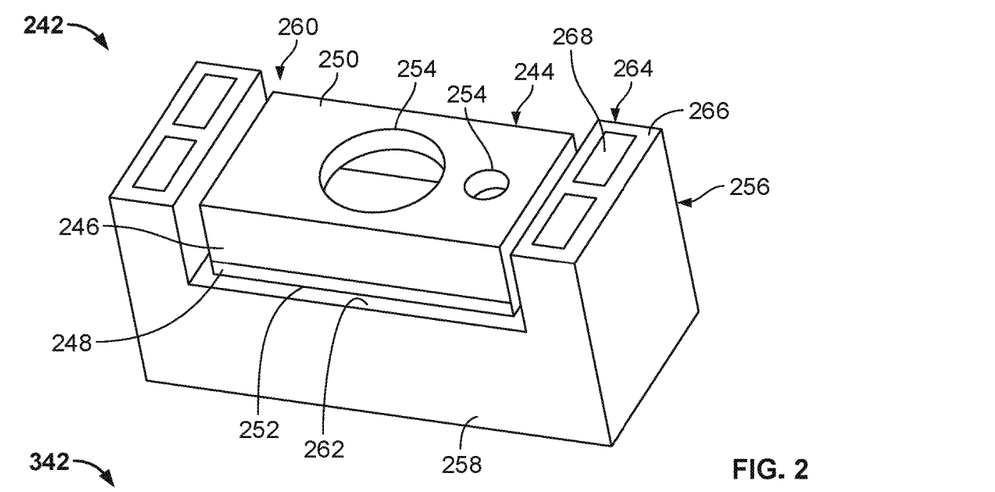
FIG. 2 is perspective view of a first example proximity sensor and a frontwardly extending conductive path.

FIG. 2 illustrates a first example proximity sensor 242 including a housing 244 coupled to an interposer 256. Proximity sensor 242 includes a housing 244 for receiving the emitter and detector of an appropriately configured sensing element (not shown). Housing 244 includes a frame 246 extending from a base 248 to define an internal cavity within which the sensing element is disposed. In some examples, frame 246 can be provided in the form of a molded monolithic plastic body formed by injection molding or some comparable technique. However, the structure and material composition of frame 246 may vary across different implementations (e.g., based on the configuration of the sensing element).

The emitter-detector pair of the sensing element is mounted to base 248. This mounting is configured to facilitate an electrical connection between the sensing element and base 248. Accordingly, base 248 may include one or more appropriately configured regions to form such a connection, such as exposed electrical contacts or reflow regions (not shown). In some examples, base 248 can be provided in form of a circuit board having a pattern of conductive and insulating layers that form a defined conductive path through base 248. Base 248 and frame 246 may be formed as discrete components coupled to one another via conventional attachment mechanisms (e.g., adhesives, fusing, mechanical fasteners, etc.) or may be formed integrally as a single component.

Surface 250 of frame 246 provides an exposed "front surface" of housing 244 (i.e., an outer surface in the frontward Z direction of the electronic device) and surface 252 of base 248 provides an exposed "rear surface" of housing 244 (i.e., an outer surface in the rearward Z direction of the electronic device). In this example, housing 244 includes apertures 254 extending through front surface 250. Apertures 254 lead to the internal cavity of housing 244, exposing the emitter-detector pair of the sensing element to send and receive signal transmissions through housing 244 in the frontward Z direction.

Interposer 256 serves as a structural component that carries (or physically supports) proximity sensory 242, including housing 244 and the sensing element contained therein. In this example, interposer 256 is configured to provide a frontward facing connection to another portion of electronic device 200. For example, interposer 256 may be coupled to a portion of a display assembly (e.g., extension tab 140 or cover 104 of FIGS. 1A and 1B). In some examples, interposer 256 may also provide a structural and/or electrical connection to an underlying circuit board (e.g., circuit board 118 of FIGS. 1A and 1B). In some other examples, interposer 256 can be formed as an integral part of a circuit board. In still some other examples, interposer 256 can be installed as a "floating" component having only the frontward connection and no underlying structural or electrical connections to a circuit board or any other component.

Interposer 256 includes a monolithic body 258 made (at least partially) of semiconductor material (e.g., silicon). Body 258 includes a frontward-facing recess (or channel) 260 defining a floor 262 between opposing raised shoulders 264. As the outermost surfaces in the frontward Z direction, surfaces 266 provide a "front surface" of interposer 256. Housing 244 of proximity sensor 242 is mounted to floor 262. In this example, the height of shoulders 264 is equal to or greater than that of housing 244. Thus, housing 244 fits entirely within the voided space defined by recess 260 in the Z direction. As previously discussed, the sensing element is mounted to the housing's base 248 to form an electrical connection between them. The mounting between housing 244 and the interposer's floor 262 forms a similar electrical connection, which provides a conductive path from the sensing element, through housing 244, and to interposer 256. Electrical traces and vias extending through the interposer's body 258 route the conductive path through shoulders 264 to electrical contacts 268 presented at front surface 266. Electrical contacts 268 facilitate the frontward facing connection of interposer 256 to another component of the electronic device (e.g., display assembly 120 of FIGS. 1A and 1B). Suitable surface mounting techniques (e.g., wave or reflow soldering) can be used to form the frontward facing connection. An anisotropic conductive adhesive (ACA), such as an anisotropic conductive film and/or anisotropic conductive paste could also be used.

Figure 3A:
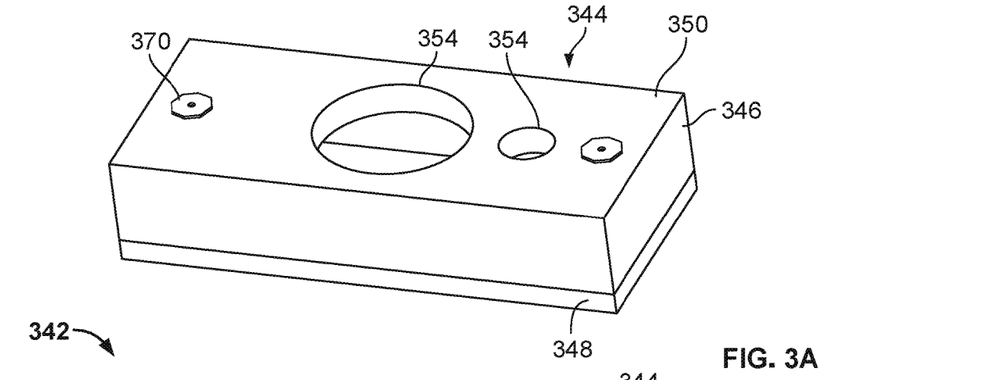
FIGS. 3A and 3B are perspective and cross-sectional views of a second example proximity sensor and a frontwardly extending conductive path.
Figure 3B:
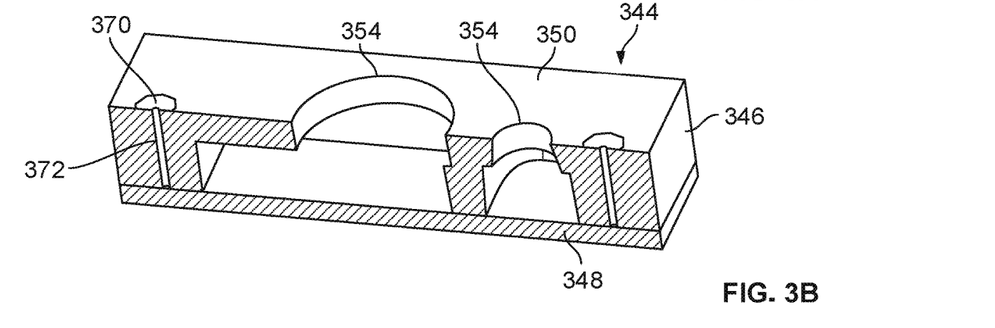

FIGS. 3A and 3B illustrate a second example proximity sensor 342, which is similar to the first example proximity sensor 242 of FIG. 2. For instance, like the prior example, proximity sensor 342 includes a housing 344 including a frame 346 extending from a base 348 to define an interior cavity for receiving the emitter and detector of a sensing element. These sensing element components are mounted to base 348 at an electrical connection point. Apertures 354 extending through front surface 350 of housing 344 expose the emitter-detector pair of the sensing element through housing 344 in the frontward Z direction.

In this example, housing 344 not only carries the sensing element but also provides a conductive path leading from the sensing element to front surface 350. This enables housing 344 to be directly connected to another component of the electronic device in front of proximity sensor 342 absent an intervening interposer (or other similar component that might otherwise carry proximity sensor 342 and facilitate a frontward facing connection). Accordingly, frame 346 includes electrical contacts 370 located on front surface 350 and conductive traces 372 that extend through frame 346 in the Z direction to provide a conductive path between base 348 and the frame's front surface 350. Additional traces (not shown) may extend along base 348 from the connection point(s) with the sensing element to complete the path from the sensing element to frontward facing electrical contacts 370.

In this example, frame 346 is a molded interconnect device (MID)—an injection-molded thermoplastic part with integrated electrical contacts 370 and conductive traces 372. To manufacture frame 346, a laser direct structuring (LDS) process can be used to selectively activate a dormant metallic compound within the molded thermoplastic material to form electrical contacts 370 and traces 372. Various other structural configurations and manufacturing techniques could also be used. For example, frame 346 could be formed using photolithographic manufacturing techniques employed for manufacturing integrated circuits. Frame 346 and base 348 can be formed integrally as a single component or formed separately and attached to one another using appropriate methods to form a conductive path from base 348 to electrical contact 370.

Figure 4A:
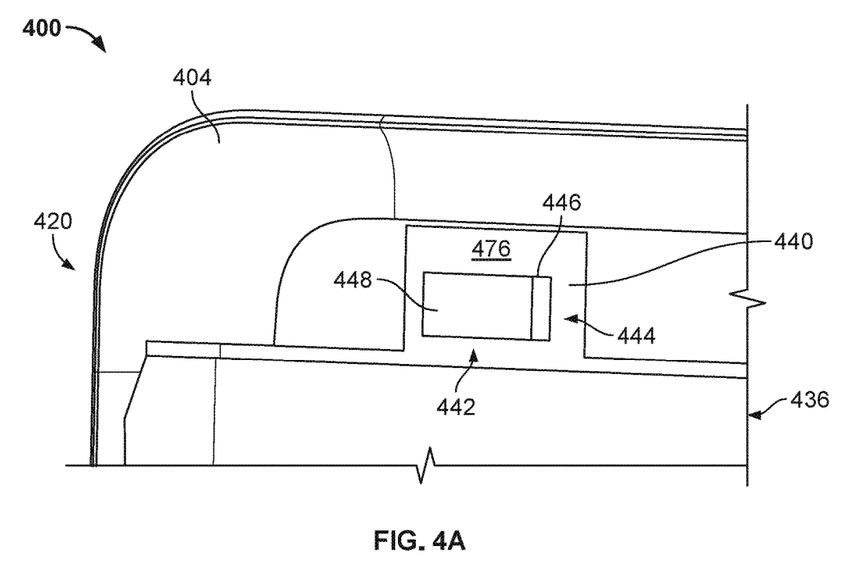
FIG. 4A is a partial rear perspective view of a sub-assembly of an electronic device illustrating a connection between a proximity sensor and a component of a display assembly.
Figure 4B:
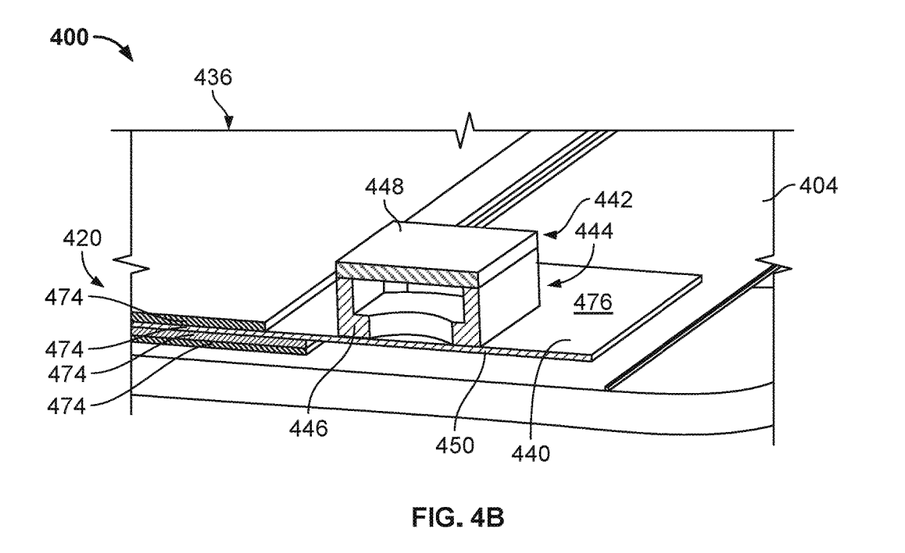
FIGS. 4B and 4C are cross-sectional views of the sub-assembly of FIG. 4A.
Figure 4C:
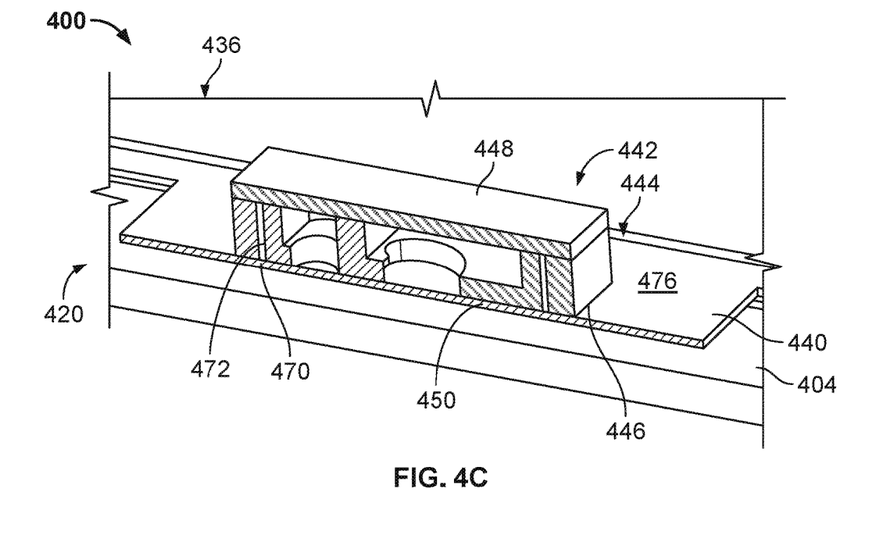

FIGS. 4A-4C illustrate an example proximity sensor 442 coupled to a portion of a display assembly 420 placed in front of the sensor as part of an assembly of components in an electronic device 400. Similar to the example described above in connection with FIGS. 1A and 1B, display assembly 420 includes a display panel 436 enclosed by a cover 404 in front of the panel. Display panel 436 includes multiple substrate layers 474, with a particular layer projecting outward to form an extension tab 440. Proximity sensor 442 is similar to the example described in connection with FIGS. 3A and 3B, including a housing 444 provided by a frame 446 extending from a base 448 to define an internal cavity for receiving a sensing element. The sensing element is secured to base 448 by an electrical connection, and frame 446 includes integral conductive traces 472 leading from base 448 to electrical contacts 470 exposed on a front surface 450 of frame 446. As shown, the frame's front surface 450 is attached to a rear surface 476 of extension tab 440. This attachment, which may be formed via surface mounting techniques or conductive adhesive, provides an electrical connection that extends a conductive path through electrical contacts 470 to conductive lines formed along extension tab 440.

Figure 5:
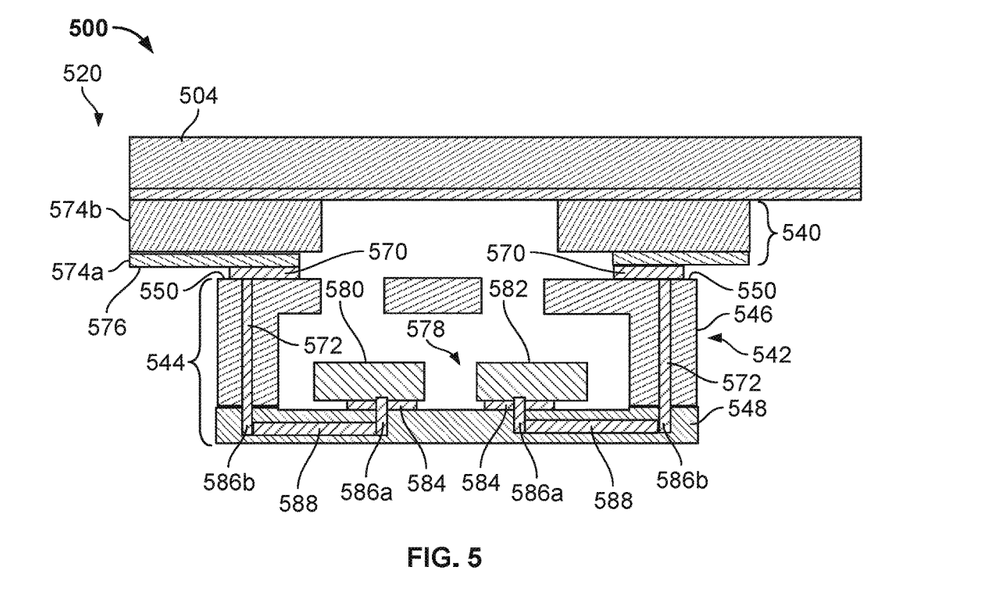
FIG. 5 is a schematic diagram illustrating a proximity sensor coupled to a display assembly with a conductive path extending from the sensor in a frontal direction of an electronic device.

The schematic diagram of FIG. 5 illustrates certain details of the configuration discussed above with reference to FIG. 4. For instance, FIG. 5 illustrates the mounting of sensing element 578 to base 548 of the proximity sensor's housing 544. In this example, sensing element 578 includes an emitter 580 and a detector 582, each of which is secured to a respective electrical contact 584 of base 548. Vias 586a,b and conductive traces 588 provide conductive paths through base 548 that extend from emitter 580 and detector 582 to frame 546. As discussed above, frame 546 is attached to base 548 such that the conductive path extends frontward in the Z direction through the frame's conductive traces 572 and to electrical contacts 570 exposed on a front surface 550 of frame 546. Electrical contacts 570 are connected to a rear surface 576 of extension tab 540, which is an outward projection of a display assembly 520 of electronic device 500. In this example, extension tab 540 includes two substrate layers 574a,b of a display panel 536. Layer 574a is a conductive film including printed or integral conductive traces that route the conductive path from sensing element 578 towards a processor of electronic device 500. Layer 574b is a support substrate that bears at least a portion of the weight of proximity sensor 542, and secures the sensor to a cover 504 enclosing display assembly 520.

Figure 6:
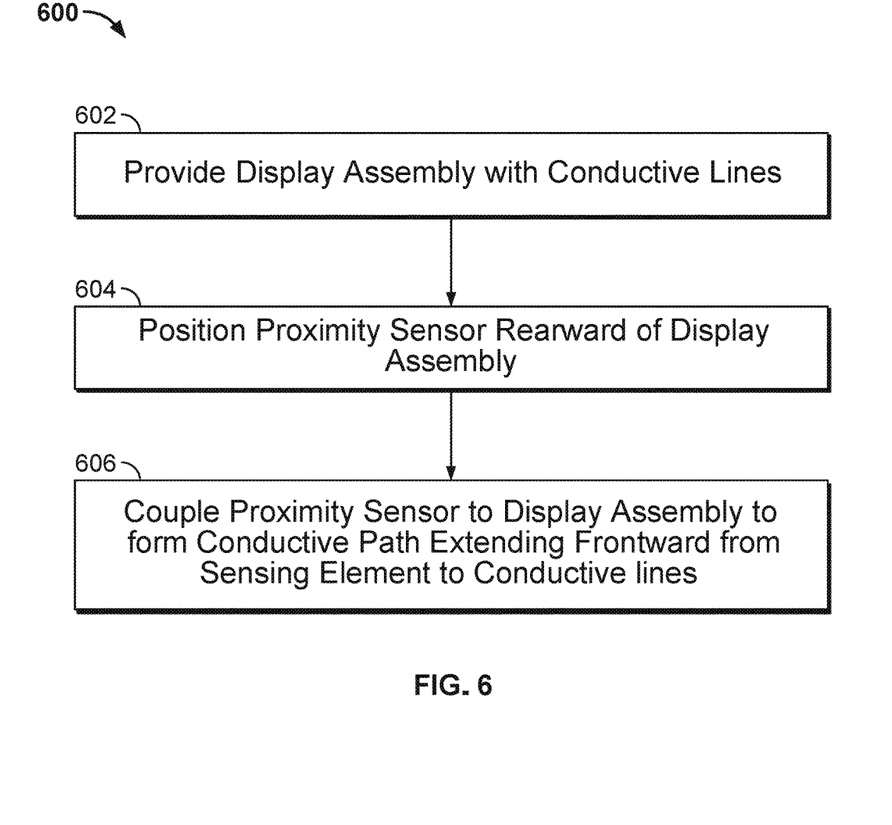
FIG. 6 is a flow diagram of a method of manufacturing an electronic device including a frontward facing proximity sensor.

FIG. 6 provides a flow diagram of an example method 600 of manufacturing an electronic device including a frontward facing proximity sensor. Method 600 includes operation 602 of providing a display assembly having conductive lines. The display assembly may be configured to generate an optical image viewable from a frontal direction of the electronic device (e.g., in response to control signals from a processor). In some examples, the display assembly includes multiple components (e.g., a display panel, support substrates, and/or conductive substrates) and layers (e.g., adhesive layers, a polarizing layer, and/or a layer configured to provide touch-sensing capabilities). In some examples, the conductive lines of the display assembly extend along (e.g., across, between, and/or through) one or more components and/or layers of the display assembly to form a conductive path suitable for conveying electronic signals (e.g., control, data, or power signals).

Method 600 further includes operation 604 of positioning a proximity sensor rearward of the display assembly in the Z direction of the electronic device. In some examples, the proximity sensor includes a sensing element disposed in a housing. The housing may serve as a support structure used to carry the sensing element and attach the proximity sensor to the display assembly in front of the sensor. In some examples, the housing is mounted on an interposer (or some other external component, such as a jumper board or a printed circuit board), and the interposer serves as the support structure.

Method 600 further includes operation 606 of coupling the proximity sensor and the display assembly while the sensor is rearward of the display. Coupling the proximity sensor and the display assembly forms a conductive path from the sensing element to the conductive lines of the display assembly. In some examples, the support structure carrying the sensing element (e.g., the sensor housing or interposer) includes one or more conductive lines (e.g., traces and/or vias) extending along (e.g., through and/or across) the support structure to one or more electrical contacts exposed on a front surface of the support structure. The electrical contacts can form an electrical connection with a mating portion of the display assembly. For instance, the display assembly may include a display panel having an extension tab configured to at least partially support the proximity sensor and form the connection with the contacts of the support structure.

While this specification contains many specific implementation details, these should not be construed as limitations on the scope of the disclosed technology or of what may be claimed, but rather as descriptions of features that may be specific to particular embodiments of particular disclosed technologies. Certain features that are described in this specification in the context of separate embodiments can also be implemented in combination in a single embodiment in part or in whole. Conversely, various features that are described in the context of a single embodiment can also be implemented in multiple embodiments separately or in any suitable subcombination. Moreover, although features may be described herein as acting in certain combinations and/or initially claimed as such, one or more features from a claimed combination can in some cases be excised from the combination, and the claimed combination may be directed to a subcombination or variation of a subcombination. Similarly, while operations may be described in a particular order, this should not be understood as requiring that such operations be performed in the particular order or in sequential order, or that all operations be performed, to achieve desirable results. Particular embodiments of the subject matter have been described. Other embodiments are within the scope of the following claims.

What is claimed is:

1. An electronic device, comprising:
a display assembly comprising an electronic display configured to generate an optical image viewable from in front of the electronic device;
a proximity sensor coupled to at least a portion of the display assembly, the proximity sensor comprising a sensing element configured to be responsive to presence of an object in front of the electronic device, the sensing element supported by a support structure having an upper surface facing a frontal direction of the electronic device, wherein the support structure comprises a body carrying a housing of the proximity sensor within which the sensing element is disposed; and a conductor that electrically connects the sensing element of the proximity sensor and the portion of the display assembly, the conductor comprising a conductive path extending along the support structure to the upper surface of the support structure.

2. The electronic device of claim 1, wherein the support structure is physically and electrically connected to the portion of the display assembly by one or more connections at the upper surface of the support structure.

3. The electronic device of claim 2, wherein the one or more connections at the upper surface of the support structure provide the only connection of the proximity sensor to another component of the electronic device.

4. The electronic device of claim 1, wherein the portion of the display assembly coupled to the proximity sensor comprises at least one of a display panel or a cover located atop the display panel.

5. The electronic device of claim 1, wherein the portion of the display assembly coupled to the proximity sensor comprises an extension tab projecting outward from an edge of a substrate of the display assembly.

6. The electronic device of claim 1, wherein the housing of the proximity sensor includes: (i) a base to which the sensing element is mounted, and (ii) a frame extending from the base to define the upper surface of the support structure.

7. The electronic device of claim 6, wherein the frame comprises a molded monolithic body, and wherein the conductor comprises an integral portion of the body of the frame.

8. The electronic device of claim 1, wherein the body of the support structure is connected to a portion of a circuit board.

9. The electronic device of claim 1, wherein the body of the support structure is comprised of a semiconductor material, and wherein the conductor extends through a portion of the body.

10. The electronic device of claim 1, wherein the body of the support structure comprises a recess defining a floor between opposing raised shoulders, the housing of the proximity sensor mounted to the floor, and the shoulders defining the upper surface of the support structure.

11. A portable electronic device, comprising:
a substrate coupled to a body of the device;
a sensor assembly comprising a sensing element configured to transmit and receive signals, the sensor assembly further comprising a front surface physically attached and electrically connected to the substrate, wherein the sensor assembly comprises a housing receiving the sensing element, and wherein the front surface of the sensor assembly comprises a portion of the housing; and
a conductor electrically connecting the sensing element and the substrate, the conductor comprising a conductive path extending from the sensing element to the front surface of the sensor assembly.

12. The portable electronic device of claim 11, wherein the substrate comprises a portion of a display assembly, and wherein the sensor comprises a proximity sensor.

13. The portable electronic device of claim 11, wherein the housing includes: (i) a base to which the sensing element is mounted, and (ii) a frame extending from the base to define the upper surface of the sensor assembly.

14. The portable electronic device of claim 13, wherein the frame comprises a molded monolithic body, and wherein the conductor comprises an integral portion of the body of the frame.

15. The portable electronic device of claim 11, wherein the sensor assembly comprises a body of semiconductor material carrying a housing within which the sensing element is disposed, and wherein the conductor extends through a portion of the body of semiconductor material.

16. The portable electronic device of claim 15, wherein the body of semiconductor material comprises a recess defining a floor between opposing raised shoulders, the housing mounted to the floor, and the shoulders defining the upper surface of the sensor assembly.

17. A method of manufacturing an electronic device, the method comprising:
providing a display assembly configured to generate an optical image viewable from a frontal direction of the electronic device, the display assembly comprising one or more conductive lines extending along the display assembly;
positioning a proximity sensor in a rearward location relative to at least a portion of the display assembly, the proximity sensor comprising a sensing element arranged to be responsive to presence of an object in front of the electronic device, the sensing element supported by a support structure having an upper surface facing a frontal direction of the electronic device, wherein the support structure comprises a body carrying a housing of the proximity sensor within which the sensing element is disposed; and
while the proximity sensor is in the rearward location, coupling the proximity sensor and the display assembly to form a conductive path from the sensing element to the conductive lines of the display assembly.

18. An electronic device, comprising:
a display assembly configured to provide visual output viewable from in front of the display assembly;
one or more electrically conductive components configured to provide an electrical connection between the display assembly of the electronic device and a circuit board of the electronic device;
a sensor assembly comprising at least one sensing element configured to detect a presence of an object that is in front of the display assembly and to transmit output indicating the presence of the object; and
a support structure for the sensor assembly, the support structure being physically attached and electrically connected to both the sensor assembly and a rearward-facing portion of the display assembly, and not being physically mounted to the circuit board of the electronic device.

* * * * *